United States Patent [19]

Deibert et al.

[11] Patent Number: 4,514,683
[45] Date of Patent: Apr. 30, 1985

[54] TAMPER INDICATING AND THEFT PREVENTING ELECTRICAL METER

[76] Inventors: Richard L. Deibert, 24404 Attwood Ave., Sunnymead, Calif. 92388; Gary L. Mikeal, 35375 Fir St., Yucaipa, Calif. 92399

[21] Appl. No.: 431,814

[22] Filed: Sep. 30, 1982

[51] Int. Cl.³ .............................................. G01R 1/00
[52] U.S. Cl. .................................. 324/110; 340/540; 340/637
[58] Field of Search ................ 340/540, 637; 324/110; 235/130 R

[56] References Cited

U.S. PATENT DOCUMENTS

| | | | |
|---|---|---|---|
| 3,915,112 | 10/1975 | Forester | 324/110 |
| 4,039,943 | 8/1977 | Tapscott | 324/110 |
| 4,150,371 | 4/1979 | Scaglione | 340/637 |
| 4,327,324 | 4/1982 | Welz | 324/110 |

Primary Examiner—Michael J. Tokar
Attorney, Agent, or Firm—Lyon & Lyon

[57] ABSTRACT

A watt-hour meter with a rotatable metering movement responsive to the flow of electrical energy through the meter having a flagging means that indicates if someone has tampered with the meter by attempting to drive the metering movement in reverse and a stop element to prevent the metering movement from rotating in reverse.

15 Claims, 5 Drawing Figures

TAMPER INDICATING AND THEFT PREVENTING ELECTRICAL METER

BACKGROUND OF THE INVENTION

This invention relates to watt-hour meters. In particular, the invention is directed to preventing the theft of electrical energy and alerting an electrical supplier to the fact that an electrical user has tampered with the meter.

An expensive and growing problem besetting utility companies is the theft of electrical energy achieved by meter tampering. One commonly known method for stealing electricity is to drive the metering movement backward. This is accomplished when the user inverts his watt-hour meter from its forward orientation by removing it from the socket, turning it upside down and replacing it in an inverted position. In this position the line conductors are connected in reverse, causing a phase reversal in the winding's magnetic field which then drives the metering movement backwards. Consequently, as electricity is used, the meter dials rotate backwards indicating reduced consumption, when in fact, electrical energy is actually being consumed.

One known method for preventing inversion, as described in U.S. Pat. Nos. 4,034,290 (Warren) and 4,104,588 (Westberry), is to provide meter mounting means and socket means that mate only when the meter is plugged into the socket in an upright position. However, this is economical only in new installations because of expenses involved in removing standard meter installations and replacing them with newly designed meters and connections.

Another known means to indicate tampering is the "red flag" indicator disclosed in U.S. Pat. No. 3,915,112 (Forester). The indicator is gravity actuated and thus an inherent problem with such a device is that any inversion of the meter could trip it, for instance during shipping. Once tripped, the meter cover seal must be broken and the cover removed to permit resetting the indicator before installing the meter. Since the meter cover seal is the manufacturer's guarantee of meter accuracy, the meter must be retested each time the seal is broken. This results in unnecessary delays and expenses.

U.S. Pat. No. 4,039,943 (Tapscott) discloses a gravity actuated switch for reversing the meter voltage winding connections when a meter is inverted thereby retaining the same rotational movement of the metering movement. This meter is relatively complex and accordingly expensive. Reference is made in Tapscott (column 1, line 38-45) to a meter by Westinghouse Electric Corporation Style No. 285A082G02 employing a detent assembly to prevent meter movement rotation in reverse. Such a device is mechanically liked to the motor assembly and is responsive to motor operation and is thus also complex and expensive.

SUMMARY OF THE INVENTION

The present invention is a watt-hour meter having a pivotally mounted stop element which pivots between two contact pins mounted inside the meter, a flagging means which is mounted on the stop element, and a third contact pin which is mounted on a rotating gear of the metering movement. When the meter is mounted in an upright position the stop element rests against a first contact pin which is remote from the metering movement. Should the meter be inverted the stop element pivots until it rests against a second contact pin proximate to the metering movement. On inverse mounting the metering movement rotates in reverse until the third contact pin contacts the end of the stop element and activates the flagging means by driving it down a channel. The flagging means then locks into position preventing further reverse rotation of the metering movement. Once activated the flagging means cannot be reset without removing the meter cover.

This watt-hour meter overcomes objections found in the prior art. The meter prevents the reverse rotational movement of the watt-hour's metering movement, provides a means to indicate that tampering with a meter has occurred, is only activated when tampering takes place, cannot be easily reset, is reliable in operation, and can be inexpensively supplied to new meters and retrofitted to installed meters.

DETAILED DESCRIPTION OF THE PREFERRED EMBODIMENT

Figure 1:
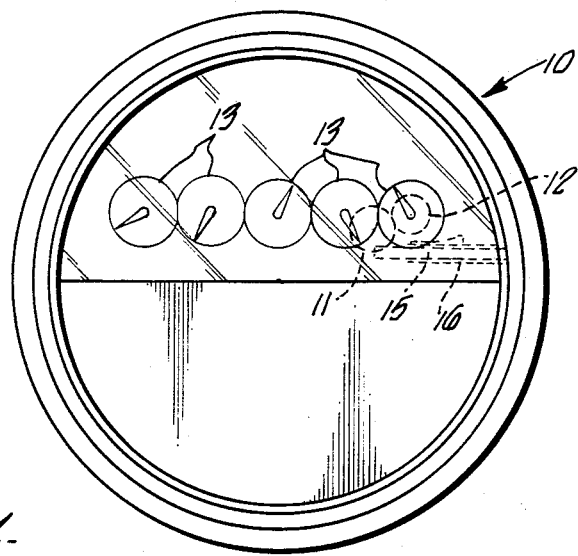
FIG. 1 is a front view of a watt-hour meter showing the positioning of the meter.

A preferred embodiment of the invention is shown in the five figures of the drawing.

FIG. 1 is a front view of a watt-hour meter 10 mounted in an upright position. The meter has a drive gear 11 that rotates in response to the electrical energy flowing through it. When mounted in this position the drive gear is arbitrarily shown to rotate in a clockwise direction when viewed from the front. Meshed with the drive gear is a dial gear 12 which is connected by a shaft to the first in a series of meter dials 13. The meter dials 13 also rotate in response to the flow of electricity through the meter.

Figure 2:
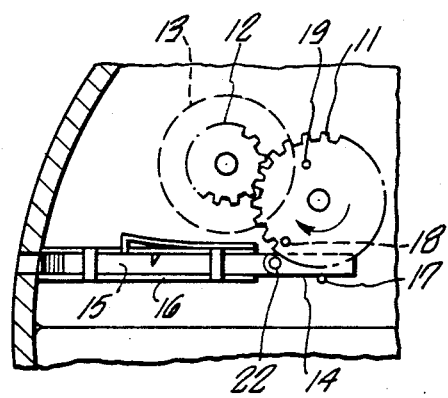
FIG. 2 is a rear view of the meter of FIG. 1 showing the position of the stop element and the flagging means when the meter is initially mounted in an upright position.

FIG. 2 is a detailed rear view of the invention as it appears when the meter 10 is initially mounted in an upright position. Viewed from this direction the drive gear 11 rotates in a counterclockwise direction. Immediately below and behind the drive gear 11 is a stop element 14 which is pivotally mounted 22 to a flagging means 15 which is located within a channel 16. The stop element rests against a first contact pin 17 and remote from a second contact pin 18. A third contact pin 19 is mounted on the drive gear 11 and rotates with the drive gear 11 but does not contact the stop element 14.

Figure 3:
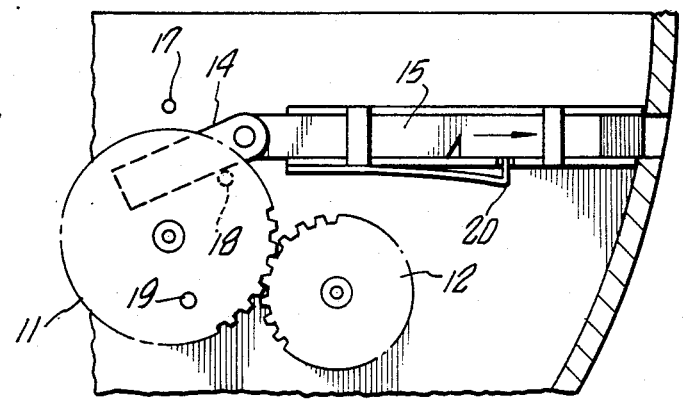
FIG. 3 is a rear view of the meter of FIG. 1 showing the position of the stop element and the flagging means immediately after the meter has been inverted and before the flagging means is actuated.

FIG. 3 is a detailed rear view of the invention as it appears immediately after the meter 10 has been inverted and prior to a third contact pin 19 striking the stop element 14. The stop element 14 now rests against the second contact pin 18 and is remote from the first contact pin 17.

Figure 4:
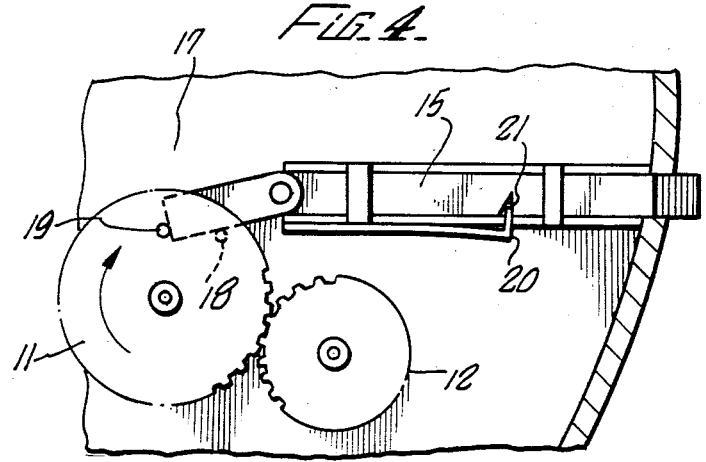
FIG. 4 is similar to FIG. 3 but showing the position of the stop element and the flagging means after the flagging means has been actuated.

FIG. 4 is similar to FIG. 3 except that the drive gear 11 has rotated along with the third contact pin 19 to where the third contact pin 19 strikes the stop element 14 driving it and the flagging means 15 towards the right. This actuates the flagging means 15 by forcing its end outside the surface of the meter 10. The flagging means 15 then locks in place by means of a spring lock 20 in notch 21. Further reverse rotation of the drive gear 11 is prevented once the spring lock 20 locks the flagging means 15 into place.

Figure 5:
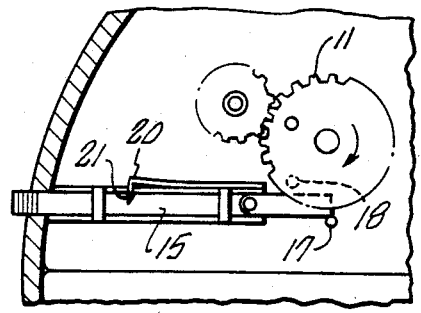
FIG. 5 is similar to FIG. 2 but showing the position of the stop element and the flagging means after the flagging means has been actuated and the meter re-installed in an upright position.

FIG. 5 is similar to FIG. 2 except that this is what exists after the flagging means 15 has been actuated. The stop element 14 has returned to rest against the first contact pin 17 and remote from the second contact pin 18. The drive gear 11 is once more free to rotate. The flagging means 15 indicates that meter tampering has occurred and the spring lock 20 prevents the user from resetting the flagging means 15 back to its original position.

Although only one preferred version of the invention has been shown and described, it is to be understood that this version is made by way of example and that various other versions are possible without departing from the subject matter coming within the scope of the following claims, which subject matter is regarded as the invention.

What is claimed is:

1. A watt-hour meter that measures the flow of electricity in a pair of line conductors, said meter comprising:
   (a) means for electrically connecting said meter to said line conductors in an upright position or in an inverted position;
   (b) winding means responsive to the flow of electricity in the line conductors;
   (c) metering movement responsive to the movement in the winding means, the metering movement rotating in a forward direction when the meter is upright and the metering movement rotating in a reverse direction when the meter is inverted;
   (d) flagging means that is actuated by the metering movement rotating in a reverse direction; and
   (e) gravity responsive stop element that prevents the reverse rotation of the metering movement, once the flagging means is actuated.

2. A watt-hour meter as claimed in claim 1 wherein the metering movement comprises a drive gear meshed with the first of one or more dial gears, the reverse rotation of the metering movement prevented when the contact pin mounted on the drive gear strikes the stop element.

3. A watt-hour meter as claimed in claim 1 wherein the stop element is an arm pivotably mounted on the flagging means.

4. A watt-hour meter as claimed in claim 3 wherein the stop element pivots between a first contact pin and a second contact pin.

5. A watt-hour meter as claimed in claim 1 wherein the flagging means locks into a fixed position by a latching means after the flagging means has been actuated by the reverse rotation of the metering movement.

6. A watt-hour meter as claimed in claim 5 wherein the latching means is spring loaded.

7. A watt-hour meter as claimed in claim 1, wherein the flagging means is an arm that is thrust down a channel which is then locked into position by a latching means.

8. In a watt-hour meter including a metering movement adapted to rotate in response to the flow of energy in a pair of line conductors connected to the meter by terminals, reverse connection of the conductors with the terminals causing reverse rotation of the metering movement, forward rotation of the metering movement occurring on upright mounting of the meter, and reverse rotation of the metering movement occurring on inverse mounting of the meter, the improvement comprising:
   (a) flagging means actuated by the reverse rotation of the metering movement;
   (b) gravity actuated stop element that prevents the reverse rotation of the metering movement, once the flagging means has been actuated; and
   (c) latching means that prevents the flagging means from being reset to its initial position.

9. A watt-hour meter as claimed in claim 8 wherein:
   (a) the stop element has a first position when the meter is mounted upright that does not prevent the rotational movement of the metering movement;
   (b) the stop element has a second position when the meter is inversely mounted that prevents the rotational movement of the metering movement; and
   (c) the stop element is an arm pivotably mounted on the flagging means and pivots between the said first position and the said second position.

10. A watt-hour meter as claimed in claim 9 wherein the flagging means is actuated by being thrust down a guide path when the stop element is in the second position and then is locked into place by a latching means.

11. A watt-hour meter as claimed in claim 10 wherein the latching means is spring biased.

12. In a watt-hour meter including a metering movement adapted to rotate in response to the flow of energy in a pair of line conductors connected to terminals on the meter, reverse connection of the conductors with the terminals causing reverse rotation of the metering movement, forward rotation of the metering movement occurring on upright mounting of the meter, and reverse rotation occurring on inverse mounting of the meter, the meter having gears which drive a plurality of meters dials, the improvement comprising:
   (a) a contact pin in one of the gears, the contact pin rotating with the gear; and
   (b) a gravity actuated stop element that contacts the contact pin when the meter is inverted and prevents the meter from registering the direct flow of energy through the meter, the stop element not being engaged by the contact pin when the meter is upright.

13. A watt-hour meter as claimed in claim 12 wherein the contact pin is in the drive gear.

14. A watt-hour meter as claimed in claim 12 further comprising flagging means connected to the stop element and is actuated by the rotating contact pin engaging the stop element, the flagging means indicating that the meter has been inverted.

15. A watt-hour meter as claimed in claim 12 or 13 further comprising a latching means locking the flagging means into the flagging position after the flagging means has been actuated.

* * * * *